(12) United States Patent
Lane et al.

(10) Patent No.: US 7,495,338 B2
(45) Date of Patent: Feb. 24, 2009

(54) METAL CAPPED COPPER INTERCONNECT

(75) Inventors: Michael Lane, Cortlandt Manor, NY (US); Stefanie R. Chiras, Peekskill, NY (US); Terry A. Spooner, New Fairfield, CT (US); Robert Rosenberg, Cortlandt Manor, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 435 days.

(21) Appl. No.: 11/376,199

(22) Filed: Mar. 16, 2006

(65) Prior Publication Data
US 2006/0157857 A1 Jul. 20, 2006

Related U.S. Application Data

(62) Division of application No. 10/877,087, filed on Jul. 9, 2004, now Pat. No. 7,119,018.

(51) Int. Cl.
*H01L 29/40* (2006.01)
(52) U.S. Cl. .................... 257/762; 257/767
(58) Field of Classification Search ............. 257/762, 257/767
See application file for complete search history.

(56) References Cited

U.S. PATENT DOCUMENTS

| | | | |
|---|---|---|---|
| 5,893,752 A | 4/1999 | Zhang et al. | |
| 5,904,565 A | 5/1999 | Nguyen et al. | |
| 5,917,244 A | 6/1999 | Lee et al. | |
| 5,939,789 A | 8/1999 | Kawai et al. | |
| 5,968,333 A | 10/1999 | Nogami et al. | |
| 5,969,422 A | 10/1999 | Ting et al. | |
| 6,181,012 B1 | 1/2001 | Edelstein et al. | |
| 6,399,496 B1 | 6/2002 | Edelstein et al. | |
| 6,461,675 B2 | 10/2002 | Paranjpe et al. | |
| 6,812,126 B1 * | 11/2004 | Velo et al. | 438/622 |
| 2003/0207561 A1 | 11/2003 | Dubin et al. | |
| 2004/0108217 A1 * | 6/2004 | Dubin | 205/291 |
| 2005/0181598 A1 | 8/2005 | Kailasam | |

\* cited by examiner

*Primary Examiner*—Roy K Potter
(74) *Attorney, Agent, or Firm*—Connolly Bove Lodge & Hutz LLP; Robert M. Trepp

(57) ABSTRACT

A conducting material comprising: a conducting core region comprising copper and from 0.001 atomic percent to 0.6 atomic percent of one or more metals selected from iridium, osmium and rhenium; and an interfacial region. The interfacial region comprises at least 80 atomic percent or greater of the one or more metals. The invention is also directed to a method of making a conducting material comprising: providing an underlayer; contacting the underlayer with a seed layer, the seed layer comprising copper and one or more metals selected from iridium, osmium and rhenium; depositing a conducting layer comprising copper on the seed layer, and annealing the conducting layer at a temperature sufficient to cause grain growth in the conducting layer, yet minimize the migration of the one or more alloy metals from the seed layer to the conducting layer. The method further comprises polishing the conducting layer to provide a polished copper surface material, and annealing the polished copper surface material at a temperature to cause migration of the one or more metals from the seed layer to the polished surface to provide an interfacial region in contact with a copper conductor core region. The interfacial region and the copper conductor core region comprise the one or more metals.

20 Claims, 3 Drawing Sheets

METAL CAPPED COPPER INTERCONNECT

CROSS REFERENCE TO RELATED APPLICATION

The present application is a divisional of U.S. patent application Ser. No. 10/887,087 filed Jul. 9, 2004.

FIELD OF THE INVENTION

The invention is directed to a conducting material having a conducting core region containing copper and an interfacial region containing one or metals selected from iridium, osmium or rhenium. The conducting materials can be used as copper interconnect structures in a semiconductor device. The invention is also directed to a process of making the conducting materials.

BACKGROUND OF THE INVENTION

Aluminum-copper and related alloys were once the preferred alloys for forming interconnect structures in electronic devices such as integrated circuit chips. However, the present demands of the microelectronic industry for increased density and high performance (speed and efficiency) requires that the interconnect structures consist of pure or nearly pure copper. Performance is improved because the resistivity of copper and certain copper alloys is much lower than the resistivity of aluminum-copper. Also, narrow interconnect structures (lines) can be used, thus providing higher wiring densities.

A single damascene process for fabricating an interconnect structure is shown in FIGS. 1A to 1D. As shown in FIG. 1A, an insulator layer 10 is deposited on a substrate and patterned to form a structure of a line or stud. An underlayer 12 is deposited along the sidewalls of the line or via as well as on the top surface of the insulator layer 10. A seed layer 14 is then deposited over underlayer 12 as shown in FIG. 1B. The function of seed layer 14 is to provide a base onto which a main conductor layer 16 can be deposited as shown in FIG. 1C. To complete the wiring step in the single damascene process, the excess copper is planarized by a method such as chemical mechanical polishing to remove the excess top surface conducting material 16, top surface seed layer 24 and top surface underlayer 22 to provide an exposed surface of a copper line or via 26. Lastly, a capping layer 18 is deposited as shown in FIG. 1D. The procedure can be repeated for the next wiring level and/or studs to build a multi-level interconnect structure. In a dual-damascene process, both a stud and a line level are fabricated in the same process step.

The seed layer in an interconnect structure can serve several functions. If the copper conducting layer is formed by a chemical vapor deposition process, a seed layer is often used to initiate the chemical deposition of the copper. In an electroplating process, a seed layer is desirable to provide electrical continuity to the electrodes which supply the plating current. In a high temperature reflow sputtering process, a seed layer is desirable for providing a surface with good wetting and nucleation growth characteristics.

U.S. Pat. No. 6,181,012 describes a seed layer for depositing a conducting layer of a copper alloy. The composition and structure of a seed layer does not have to be the same as the composition and structure of the conducting layer. For instance, the seed layer typically has a higher electrical resistivity than the copper conductor. However, as long as the cross-sectional area occupied by the seed layer is a small fraction of the entire conductor cross-sectional area, the overall line resistance is determined by the resistivity of the copper conductor.

The described seed layers are also said to minimize the electromigration of copper into the dielectric. The electromigration phenomenon occurs when the superposition of an electric field onto random thermal diffusion in a metallic solid causes a net drift of ions in the direction of the electron flow. Any diffusion of copper ions into the silicon substrate can cause device failure.

The seed layers described in U.S. Pat. No. 6,181,012 include Cu(Sn), Cu(In), Cu(Zr), Cu(Ti) and Cu(C, N, O, Cl, S). Secondary metals can be added to these alloys to improve the adhesion properties to the copper. These secondary metals include Cu(Al), Cu(Mg), and alloys of Cu with other reactive metals such as Be, Ca, Sr, Ba, Sc, Y, La, and rare earth series elements of Ce, Pr, Nd, Sm, Eu, Gd, Th, Dy, Ho, Er, Tm, Yb and Lu, and Hf, V, Mb, Ta, Cr, Mo, W, Mn, Re, Si and Ge. In addition, other secondary metals can be used to improve the surface properties of the seed layer including B, O, N, P, Fe, Ru, Os, Co, Rh, Ir, Ni, Pd, Pt, Ag, Au, Zn and Cd. A specific metal chosen was silver, which has low solubility in Cu and forms no Cu compounds. Silver also has low resistivity that is comparable to the main copper conductor. Other metals and alloys of some metals which have low solubility in Cu and form no copper compounds include Mo, W and Co.

Following the plating of the copper conducting layer and a mechanical polishing step, a capping layer is formed on the polished copper surface. The function of the capping layer is to minimize the electromigration of copper into adjacent materials. Many types of materials to cap copper have been proposed including both electroless and electrolytically plated metals as well as physical vapor deposited metal and organic-based capping materials. Selective electroless deposition of some metal alloys, in particular of CoWP, has been shown to significantly improve electromigration lifetime, see Hu et al., "Reduced Electromigration of Cu Wires by Surface Coating." *Applied Physics Letters,* 81(10), 2002, p. 1782. U.S. Pat. No. 5,695,810 describes the use of electroless deposited CoWP films as barrier layers including as a capping material for copper interconnect structures. However, electroless processes typically require some type of seed layer to initiate the nucleation of the capping material.

Rather than trying to improve upon existing seed layers or develop new seed layers for capping materials, particularly electroless CoWP capping materials, Applicants sought a different approach to forming a capping material on copper conductors.

SUMMARY OF THE INVENTION

The invention is directed to a conducting material comprising a conducting core region comprising copper and from 0.001 atomic percent to 0.6 atomic percent of one or more metals selected from the group consisting of iridium, osmium and rhenium, and an interfacial region, wherein the interfacial region comprises at least 80 atomic percent of the one or more metals.

A conducting material of the invention can include a seed region comprising copper and 0.3 atomic percent to 1.8 atomic percent of iridium, a conducting core region comprising copper and from 0.04 atomic percent to 0.1 atomic percent of iridium, and an interfacial region. The interfacial region will comprise at least 98 atomic percent iridium.

The conducting materials can be used as a copper interconnect in a semiconductor structure. The semiconductor structure would comprise: a trench or a via disposed within a dielectric material, wherein the trench or via includes an underlayer disposed along the sidewalls of the trench or the via; a copper conductor core within the trench or the via, wherein the conductor core comprises from 0.01 atomic percent to 0.6 atomic percent of one or more metals selected from the group consisting of iridium, osmium and rhenium; and an interfacial layer comprising 80 atomic percent or greater of the one or more metals.

The invention is also directed to a method of making a conducting material. The method comprises: providing an underlayer; contacting the underlayer with a seed layer, wherein the seed layer comprises copper and one or more metals selected from the group consisting of iridium, osmium and rhenium; depositing a conducting layer comprising copper on the seed layer, and annealing the conducting layer at a temperature sufficient to cause grain growth in the conducting layer, yet minimize the migration of the one or more metals from the seed layer to the conducting layer. The method further comprises polishing the conducting layer to provide a polished copper surface material, and annealing the polished copper surface material at a temperature to cause migration of the one or more metals from the seed layer to the polished surface to provide a copper conductor core region in contact with an interfacial region. The interfacial region and the copper conductor core region comprise the one or more metals.

BRIEF DESCRIPTION OF THE DRAWINGS

This invention will be better understood by reference to the Detailed Description of the Invention when taken together with the attached drawings, wherein.

DETAILED DESCRIPTION OF THE INVENTION

Figure 1A:
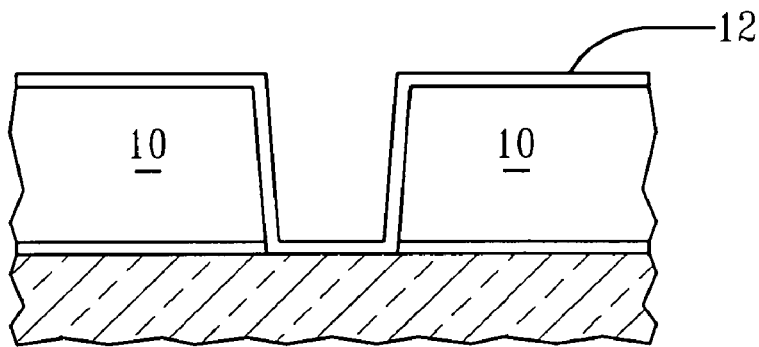
FIG. 1A is a cross-sectional view of an opening for forming a interconnect structure having a diffusion barrier layer deposited therein.
Figure 1B:
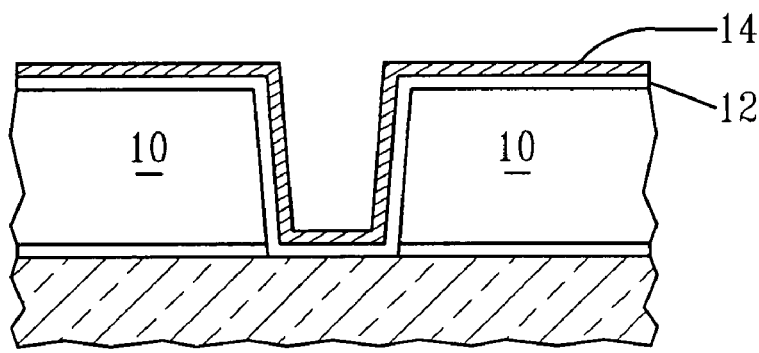
FIG. 1B is a cross-sectional view of FIG. 1A with a copper alloy seed layer deposited therein.
Figure 1C:
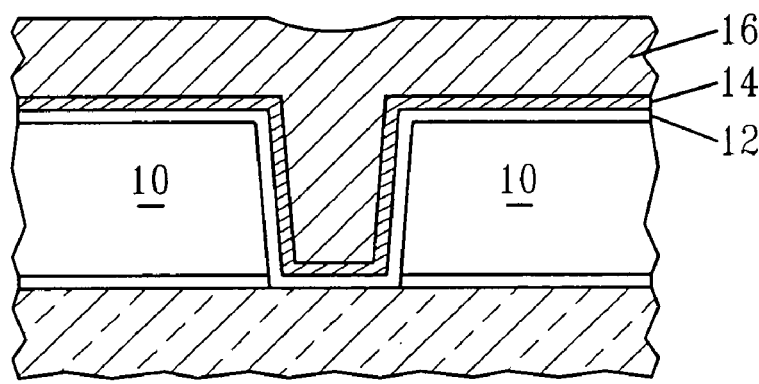
FIG. 1C is a cross-sectional view of the opening of FIG. 1B having a copper conductor material deposited therein.
Figure 1D:
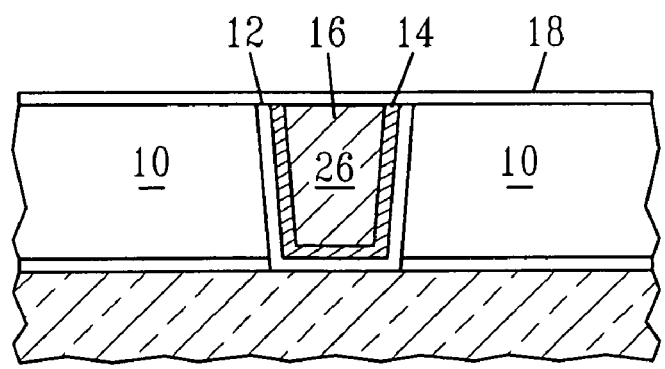
FIG. 1D is a cross-sectional view of FIG. 1C having the excess copper removed.

Applicants have developed novel conducting materials that comprises a conducting core region and an interfacial region. The conducting core region comprises primarily copper and one or more metals selected from iridium, osmium or rhenium. The one or more metals present in the conducting core region is from 0.001 atomic percent to 0.6 atomic percent. The interfacial region comprises 80 atomic percent or greater of the one or more metals. Many of the conducting materials will have a conducting core region with 0.001 atomic percent to 0.4 atomic percent of the one or more metals. Many of the conducting materials will have an interfacial region with 90 atomic percent or greater of the one or more metals. The interfacial region forms as a result of a novel process which provides for the migration of the one or more metals from a deposited seed layer to a polished surface of a copper conductor.

The conducting materials of the invention can be characterized as a composite-like material having a seed region, a core region and an interfacial region. The term "conducting core region" is defined as a region of the conducting material containing at least 90 atomic percent copper, and a relatively constant copper-metal atomic concentration profile. Likewise, the term "interfacial region" is defined as a region of the conducting material containing at least 80 atomic percent of one or more metals selected from iridium, osmium or rhenium with a relatively constant metal atomic concentration profile. The term "seed region" is also defined as a region of the conducting material containing one or more metals selected from iridium, osmium or rhenium with a relatively constant metal atomic concentration profile. The seed region, core region and interfacial region are all formed as a result of the process of making the conducting material.

The seed region, conducting core region and interfacial region do not include regions of the conducting material whereby the atomic percent concentration profile of the copper and the one or more metals is not relatively constant such as in the core-interfacial boundary region at the interface of the conducting core region and the interfacial region. One would expect that the atomic concentration profile of copper and the one or more metals in the core-interfacial boundary region would be more gradient than constant. The same would be true for a core-seed boundary region that can exist in the conducting material between the core conducting region and the seed region.

The invention is directed to a method of making a composite material comprising: providing an underlayer; contacting the underlayer with a seed layer, wherein the seed layer comprises copper and one or more metals selected from iridium, osmium or rhenium; depositing a copper conducting layer on the seed layer, and annealing the conducting layer at a temperature sufficient to cause grain growth in the conducting layer, yet minimize the migration of the one or more metals from the seed layer to the conducting layer; polishing the conducting layer to provide a polished composite; and annealing the polished surface composite at a temperature to cause migration of the one or more metals in the seed layer to the polished surface to provide an interfacial layer comprising the one or more metals.

The seed layer is formed by one or more methods known to those skilled in the art. For example, the seed layer can be formed by chemical vapor deposition (CVD) physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering. The seed layer can also be deposited by a sequential deposition of copper and the one or more metals, which can then be interdiffused by an appropriate heating treatment. If the composite structure is a semiconductor structure, the seed layer is typically deposited on an underlayer disposed in a trench or a via within a dielectric material.

The concentration of the one or more metals in the deposited seed layer is from 1 atomic percent to 10 atomic percent. In many instances, the deposited seed layer will contain from 1 atomic percent to 7 atomic percent.

Following the deposition of the seed layer, the copper conducting layer is deposited. Again, if the composite structure is a semiconductor structure, the copper conducting layer fills the trench or via. With regard to some applications, the copper conductor layer can include an alloying element such as C, N, O, Cl or S which have been shown to improve the reliability of the copper conductor. The amount of alloying element in the copper alloy is typically in the range from about 0.001 wt. % to about 10 wt. %.

The copper conductor layer can be formed by electroless, CVD or by electrochemical processes. The deposition of the copper can proceed by electrochemical deposition such as electroplating or electroless plating. Examples of suitable copper electroplating compositions are disclosed in U.S. patent application Ser. No. 09/348,632, assigned to International Business Machines, the entire disclosure of which is incorporated herein by reference.

Following the deposition of the copper conducting layer, the layered structure is annealed at a temperature sufficient to cause grain growth in the copper conducting layer, yet minimize the migration of the one or more metals from the seed layer to the conducting layer. One wants to minimize the degree of migration of the one or more metals to the copper conducting layer because some of the metals have a tendency to migrate to the free (exposed) surface of the copper conducting layer. Although applicants take advantage of this observed migration effect during a subsequent annealing step, significant migration of the one or more metals to the free surface would lead to removal of the expensive metals from the material in the following polishing step. Essentially, one would be introducing the metals in the seed layer only to remove them in the polishing of the copper conducting layer. Obviously, one would want to minimize such an occurrence.

There are many methods one skilled in the art can use to anneal the copper conducting layer to promote crystallization. To promote crystal growth of the deposited copper layer yet minimize the degree of migration of the one or more metals from the seed layer into the copper layer one would use a low temperature anneal, e.g., an anneal for one hour at 100° C. One skilled in the art, once provided with the knowledge of applicant's process, could modify the low temperature anneal process to minimize the degree of migration of the one or more metals into the conducting layer.

One way to minimize the degree of migration of the one or more metals from the seed layer to the conducting layer during a low temperature anneal is not to exceed a temperature of 200° C. for more than five minutes. Of course, this stated temperature-time range results from a general experimental observation made by the applicants, and is not a stringent rule that needs to be followed. The amount of time the conducting layer is annealed at temperatures below 200° C. will also factor into the degree of migration of the one or more metals. For example, the temperature of the low temperature anneal may exceed 200° C. for more than five minutes if a rapid thermal anneal process is used. With this in mind, applicants decided that, in general, the temperature during the annealing of the conducting layer should not exceed a temperature of 200° C. for more than 5 minutes.

Following the low temperature anneal, that is, annealing of the conducting layer to promote and initiate grain growth in the copper conducting layer, a planarization process is carried out, e.g. by CMP, to remove the excess copper, seed layer and diffusion/adhesion layers that would have formed on a surface of adjacent materials. In a semiconductor structure, the adjacent material is likely to be a dielectric.

The polishing process can also include an electropolishing process. In an electropolishing process small amounts of copper are etched from the copper layer by electroetch or electrochemical polishing to provide a copper interconnect structure having a top copper surface below the top surface of the dielectric. Such a structure is often referred in the art as a recessed structure.

Following the polishing step the layered structure is annealed at a relatively high temperature to cause migration of the one or more metals in the seed layer to the polished surface to provide an interfacial region containing the one or more metals. The migration of the one or more metals from the seed layer to the polished copper surface is facilitated by an annealing temperature of 250° C. or greater. Again, this stated temperature limit results from a general experimental observation made by applicants, and is not a stringent rule that needs to be followed. Of course, the degree of migration will also depend on the time the structure is annealed, the temperature profile of the anneal and the metal used. The lower the anneal temperature, the longer the anneal time required for a desired degree of migration. With this in mind, applicants decided that, in general, the time and temperature during the annealing of the polished copper surface material should be at least 30 minutes at 250° C. or greater to optimize the extent of migration, yet minimize anneal times. Annealing temperatures of 300° C. or greater are often used to promote the migration of the metals to the polished copper surface. For example, annealing the polished copper surface material at about 325° C. to about 425° C. for about one hour can be used.

The method of the invention provides for the migration of the one or more metals from the seed layer to the polished copper surface material. The result of this migration provides an interfacial region that can also function as a capping layer. As a result, the method provides for the automatic capping of the copper conducting core.

The method of the invention provides an interfacial region with a high atomic concentration of the one or more metals. The thickness of the interfacial region can be from a few monolayers of metal, e.g., about 5 Å, to about 20 Å. The resulting interfacial region will comprise 80 atomic percent of the one or more metals or greater. In many instances, the resulting interfacial region will comprise 90 atomic percent of metal or greater.

Applicants investigated several different metals at various atomic percent concentrations to understand which metals and at what atomic concentration provided conducting materials with the most desirable properties. Iridium is a quite unique metal inclusive of osmium and rhenium (the alternative one or more metals) over other metals, in that iridium exhibits optimal migration characteristics as a result of the described process.

The selection of iridium over other metals such as rhodium, platinum, palladium and ruthenium provides a core conducting region with a relatively low atomic percent concentration of iridium compared to these other metals. Under nearly identical annealing conditions iridium migrates from the seed layer to the polished copper surface material without substantial contamination or poisoning of the conducting core region. The relatively small amounts of iridium in the conducting core region provide a conducting material with little or no increase in resistivity relative to pure copper.

As shown by applicants, each of the metals has different migration characteristics through the copper conducting layer as a result of applicant's process. Consequently, the resistivity values of the copper conductors are different with each metal. Typically, the addition of these metals into copper conductors will cause an increase in resistivity. Ideally, the conducting materials of the invention should not exhibit a resistivity much greater than that of a pure copper conductor.

The conducting materials should exhibit an electrical resistivity, not much greater than that of a comparative copper conductor without the interfacial region. The conducting materials will preferably have an electrical resistivity of about 2.3 $\mu\Omega$/cm or less.

The use of iridium over the other metals has cost advantages as well. Due to the optimal migration properties of iridium, a greater proportion of the iridium in the seed layer migrates to the polished copper surface material than the other metals. As a result, less iridium is needed to form the seed layer in the process, and eventually the interfacial region of the conducting material. Because these metals are very expensive metals, the use of small amounts of metal is an obvious advantage. Also, because very small amounts of the iridium becomes trapped in the conducting core region relative to the other metals, much smaller amounts of iridium is needed to form the conducting materials.

Applicants have shown that iridium migrates to the polished surface to a greater degree than other precious metals. For example, applicants have shown that the migration of rhodium or palladium from a deposited seed layer into the copper conducting layer provides a relatively poor conducting material under nearly identical process conditions. These two metals diffuse into the conducting layer to provide a conducting core with about 1 atomic percent of the metal. The significantly high levels of the metals in the conducting core are said to contaminate or poison the conducting core. The result is a copper conductor core with a substantial increase in resistivity. A relatively larger increase in resistivity values is a property that is certainly to be avoided.

Migration of the iridium to the polished surface provides a conducting core region comprising copper and 0.001 atomic percent to 0.6 atomic percent of iridium. In many instances, the resulting conducting core region will comprise from 0.001 atomic percent to 0.4 atomic percent iridium. In still other instances, the conducting core region will comprise from 0.001 atomic percent to 0.2 atomic percent iridium.

The migration of the iridium to the polished surface also provides a seed region of a conducting material comprising from 0.5 atomic percent to 4 atomic percent of iridium. In many instances, the resulting seed region will comprise from 0.5 atomic percent to 2 atomic percent iridium.

One exemplary conducting material includes a seed region comprising copper and 0.3 atomic percent to 1.8 atomic percent of iridium, a conducting core region comprising copper and from 0.04 atomic percent to 0.1 atomic percent of iridium, and an interfacial region, wherein the interfacial region comprises at least 98 atomic percent iridium. The electrical resistivity of the conducting material is 2.1 $\mu\Omega$/cm or less.

Another exemplary conducting material includes a seed region comprising copper and 0.3 atomic percent to 1.8 atomic percent of iridium, a conducting core region comprising from 0.05 atomic percent to 0.08 atomic percent of iridium, and an interfacial region, wherein the interfacial region comprises at least 98 atomic percent iridium. The electrical resistivity of the conducting material is 2.1 $\mu\Omega$/cm or less.

Following the formation of the interfacial region, a capping layer can be deposited on the interfacial region. Many types of materials have been used to cap copper including both electroless and electrolytically plated metals as well as physical vapor deposited metal and organic-based capping materials. Selective electroless deposition of some metal alloys, in particular CoWP, has been shown to significantly improve electromigration lifetime of copper interconnect structures. For example, an electroless CoWP capping layer can be formed on the interfacial region as described in Hu et al., "Reduced Electromigration of Cu Wires by Surface Coating." *Applied Physics Letters*, 81(10), 2002, p. 1782, of which the entire disclosure is incorporated herein by reference. U.S. Pat. No. 5,695,810, of which the entire disclosure is incorporated herein by reference, also describes electroless deposited CoWP films as a capping material for copper interconnect structures. Such electroless processes typically require a seeding scheme to initiate the nucleation of the CoWP film.

One advantage of the conducting materials is seeding prior to the deposition of the capping layer is not necessary. In effect, the interfacial region can function as the seed layer for the capping layer. This is particularly advantages if electroless CoWP is used as a capping layer.

Electrodeposited CoWP is described in a U.S. patent application, filed Nov. 18, 2003, which is assigned to International Business Machines, the entire disclosures of which is incorporated herein by reference.

The conducting materials can also include a barrier region disposed between the underlayer and the seed region. Barrier layers are typically deposited on the sidewall and bottom surfaces of an etched trench in a dielectric to minimize the electromigration of copper into the dielectric.

The barrier layer can also function as an adhesion layer because copper does not adhere well to common dielectrics such as $SiO_2$. The barrier layer can comprise one or more metal layers known to those of ordinary skill in the art. Common metals and metal alloys used in the art to form barrier layers include tantalum, tungsten, tantalum nitride, and titanium nitride. These metals are typically used as a first metal layer in contact with the dielectric layer. A second metal layer containing one or more metals selected from palladium, ruthenium, rhodium, osmium and rhenium can then be deposited on the first metal layer. The one or more metal layers are typically 10 nm to 200 nm, and more typically 50 nm to 100 nm thick. A preferred barrier layer of the invention is described in U.S. patent application Ser. No. 10/132,173, filed Apr. 26, 2002, and Ser. No. 10/279,057, filed Oct. 24, 2002, both of which are assigned to International Business Machines, the entire disclosures of which are incorporated herein by reference.

In one embodiment, the barrier layer can contain a dielectric interface material and a copper interface metal. The barrier layer can also contain a gradient concentration of a dielectric interface material and a copper interface metal. The barrier layer contains two or more regions with one region containing at least 50 atom percent, preferably at least 70 atom percent, more preferably at least 90 atom percent, of a copper interface metal. The copper interface metal is selected from ruthenium, rhodium, palladium, rhenium and osmium. The preferred copper interface metal is ruthenium. The barrier layer can also contain a region with at least 50 atom percent, preferably at least 80 atom percent, of a dielectric interface material. The dielectric interface material is selected from tungsten, tungsten nitride, titanium, titanium nitride, tantalum, and tantalum nitride. The preferred dielectric interface material is tantalum nitride.

Figure 2:
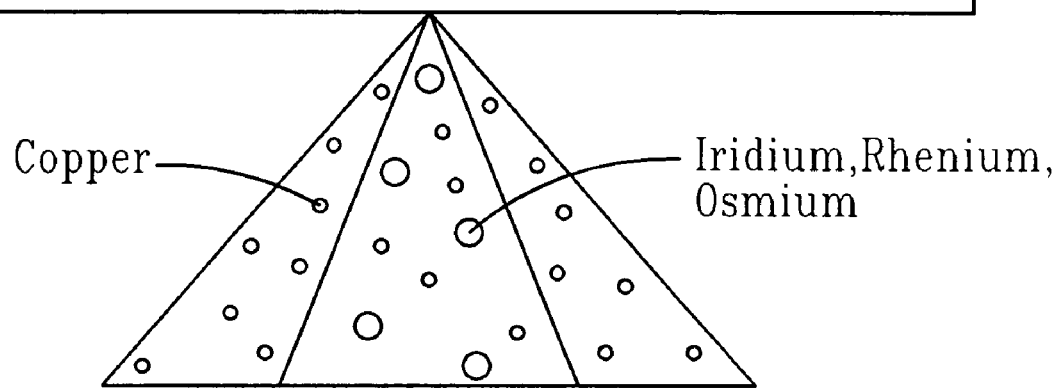
FIG. 2 is a schematic representation of a deposition process used to form a seed layer of the invention.
Figure 3A:
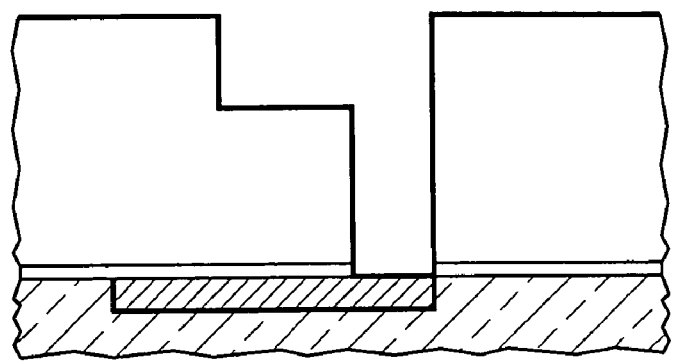
FIG. 3A-3D is a schematic representation of the steps used to prepare a conducting material of the invention.
Figure 3B:
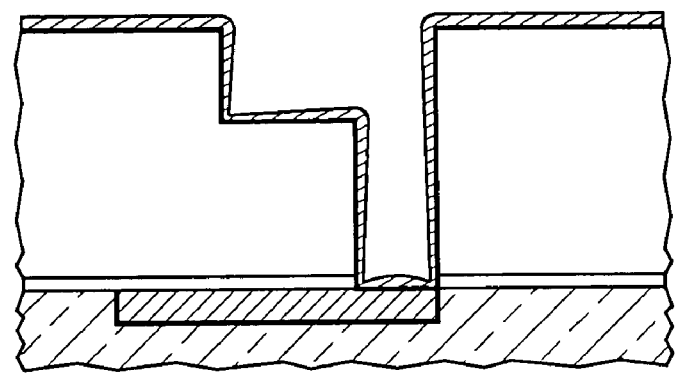
Figure 3C:
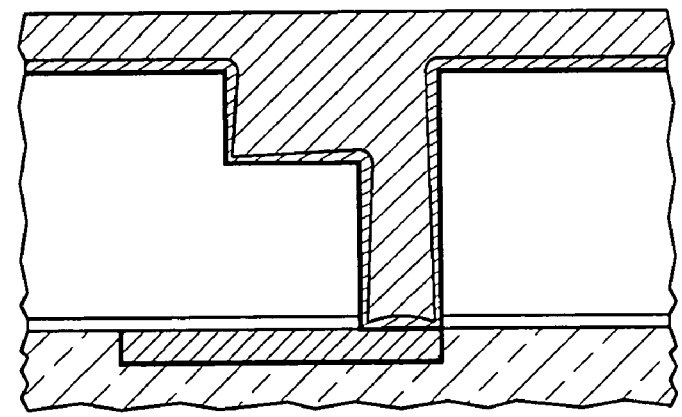
Figure 3D:
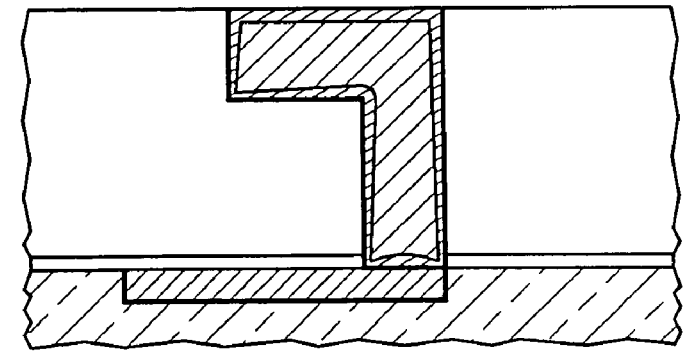

One embodiment for forming a seed layer in a dual-damascene structure of the invention is represented in FIG. 2. The use of a two-component sputtering target containing copper and a metal provides a nonuniform solid angle distribution of copper and the metal in the seed layer as shown. The high momentum versus finite sticking coefficient of the heavier alloy metal and relatively small solid angle distribution provide better step coverage than copper alone. The resulting seed layer is metal-rich in the via bottoms, via bottom sidewalls, and trench bottom sidewalls.

The process of forming conducting materials of the invention is shown in FIG. 3. FIG. 3A depicts a dual damascene pattern with a deposited barrier layer. FIG. 3B depicts a PVD deposited seed layer of the invention according to FIG. 2. Copper deposition is shown in FIG. 3C as being favored on the upper sidewalls and horizontal surfaces of the dual-damascene pattern. The resulting seed layer provides for near complete nucleation including in the lower corner regions of the dual-damascene structure. Following electrodeposition of the copper a relatively low-temperature anneal is used to initiate grain growth in the conducting layer as shown in FIG. 3D.

The annealed copper is then palanarized by CMP, thus providing a polished copper surface. A relatively high-temperature anneal is then provided to cause partial migration of the metal in the seed layer to the polished copper surface resulting in the formation of the interfacial region.

The dielectric layers used to provide the interconnect structures of the invention can be any suitable dielectric layer used in the semiconductor manufacturing industry such as an oxide, e.g., silicon dioxide, nitride, silicon nitride, or an oxynitride layer. Low-k dielectric materials, e.g., SiLK® from Dow Chemical, Coral® from Novellus, Black Diamond® from Applied Materials and spin-on silicon-based dielectrics, can also be used. The Coral® can be described generically as a SiCOH dielectric. The dielectric layer can be formed by any of various methods, including by chemical svapor deposition and spin-on techniques. Dielectric materials described in U.S. Pat. No. 6,147,009, which issued Nov. 14, 2000, and U.S. Pat. No. 6,441,491, which issued on Aug. 27, 2002, the entire disclosures of which are incorporated herein by reference, and both of which are assigned to International Business Machines, can also be used to form the interconnect structures of the invention.

EXAMPLE 1

Iridium

A barrier layer TaN/Ta is deposited by physical vapor deposition on a dielectric material. Following the barrier layer, a seed layer is deposited from a copper alloy target. A copper target containing 5 atomic percent iridium provides a seed layer with a copper alloy concentration of about 96Cu-4Ir atomic percent. Copper is then electroplated atop of the seed layer using industry standard techniques. The material with the plated copper is annealed at a temperature of 100° C. for one hour. This anneal provides large grain size in the copper, yet minimizes the migration of the iridium into the copper. Following the low temperature anneal the material is polished (CMP) to provide a polished copper surface. The polished material is then annealed at a temperature of 400° C. for 1 hour. An electroless CoWP film is deposited atop the iridium interfacial region using standard CoWP bath chemistry.

COMPARATIVE EXAMPLE 1

Palladium

A barrier layer TaN/Ta is deposited by physical vapor deposition on a dielectric material. Following the barrier layer, a seed layer is deposited from a copper alloy target. A copper target containing 5% atomic percent palladium provides a seed layer with a copper alloy concentration of about 96 Cu-4 Pd atomic percent. Copper is then electroplated atop of the seed layer using industry standard techniques. The material with the plated copper is annealed at a temperature of 100° C. for one hour. This anneal provides large grain size in the copper, yet minimizes the migration of the iridium into the copper. Following the low temperature anneal the material is polished (CMP) to provide a polished copper surface. The polished material is then annealed at a temperature of 400° C. for 1 hour. An electroless CoWP film is deposited atop the palladium interfacial region using standard CoWP bath chemistry.

COMPARATIVE EXAMPLE 2

Rhodium

A barrier layer TaN/Ta is deposited by physical vapor deposition on a dielectric material. Following the barrier layer, a seed layer is deposited from a copper alloy target. A copper target containing 5% atomic percent rhodium provides a seed layer with a copper alloy concentration of about 96Cu-4 Rh atomic percent. Copper is then electroplated atop of the seed layer using industry standard techniques. The material with the plated copper is annealed at a temperature of 100° C. for one hour. This anneal provides large grain size in the copper, yet minimizes the migration of the rhodium into the copper. Following the low temperature anneal the material is polished (CMP) to provide a polished copper surface. The polished material is then annealed at a temperature of 400° C. for 1 hour. An electroless CoWP film is deposited atop the rhodium interfacial region using standard CoWP bath chemistry.

COMPARATIVE EXAMPLE 3

Tantalum

A barrier layer TaN/Ta is deposited by physical vapor deposition on a dielectric material. Following the barrier layer, a seed layer is deposited from a copper alloy target. A copper target containing 5% atomic percent tantalum provides a seed layer with a copper alloy concentration of about 96Cu-4 Ta atomic percent. Copper is then electroplated atop of the seed layer using industry standard techniques. The material with the plated copper is annealed at a temperature of 100° C. for one hour. This anneal provides large grain size in the copper, yet minimizes the migration of the rhodium into the copper. Following the low temperature anneal the material is polished (CMP) to provide a polished copper surface. The polished material is then annealed at a temperature of 400° C. for 1 hour. An electroless CoWP film is deposited atop the rhodium interfacial region using standard CoWP bath chemistry.

Table 1 provides a summary of atomic percent values for the materials of Example 1 and Comparative Examples 1-3 obtained from data collected by Rutherford Backscattering Spectroscopy (RBS). Atomic percent values are provided for the interfacial region and conductor core region for each material. As shown, both rhodium and palladium materials do not provide interfacial regions. Instead, the metal is uniformly distributed in the copper conductor, and there is little or no preferred migration to the free copper surface. The relatively high atomic concentrations of rhodium and palladium metal in the copper conductor provides a conductor with relatively resistivity values.

TABLE 1

| Ex. | alloy metal | interfacial at. % | Bulk at. % | $\Omega$ ohm/cm$^2$ |
| --- | --- | --- | --- | --- |
| 1 | iridium | 100 | 0.07 | 1.95 |
| Comp. 1 | rhodium | 1 | 1 | 4 |
| Comp. 2 | palladium | 1 | 1 | 2.9 |
| Comp. 3 | tantalum | 100 | 0.03 | 1.95 |
| Copper control | n/a | n/a | n/a | 2 |

We claim:

1. A conducting material comprising:
   a conducting core region comprising copper and from 0.001 atomic percent to 0.6 atomic percent of one or more metals selected from the group consisting of iridium, osmium and rhenium; and
   an interfacial region, wherein the interfacial region comprises at least 80 atomic percent of the one or more metals.

2. The conducting material of claim 1, wherein the interfacial region comprises at least 90 atomic percent of iridium.

3. The conducting material of claim 2, wherein the conducting core region comprises from 0.001 atomic percent to 0.4 atomic percent of iridium.

4. The conducting material of claim 2, wherein the conducting core region comprises from 0.001 atomic percent to 0.2 atomic percent of iridium.

5. The conducting material of claim 2, further comprising a seed region, wherein the seed region comprises from 0.5 atomic percent to 4 atomic percent of iridium.

6. The conducting material of claim 1, wherein the interfacial region is from 5 Å to 20 Å in thickness.

7. The conducting material of claim 2, wherein the electrical resistivity of the conducting material is 2.3 μΩ/cm or less.

8. The conducting material of claim 1, wherein the conducting core region comprises from 0.001 atomic percent to 0.4 atomic percent of the one or more metals.

9. A semiconductor structure comprising:
   a trench or a via disposed within a dielectric material, wherein the trench or via includes an underlayer disposed along the sidewalls of the trench or the via;
   a copper conductor core within the trench or the via, wherein the conductor core comprises from 0.01 atomic percent to 0.6 atomic percent of one or more metals selected from the group consisting of iridium, osmium and rhenium; and
   an interfacial layer comprising 80 atomic percent or greater of the one or more metals.

10. The semiconductor structure of claim 9, wherein the interfacial region comprises 90 atomic percent of iridium or greater.

11. The semiconductor structure of claim 10, wherein the copper conductor core comprises from 0.001 atomic percent to 0.4 atomic percent of iridium.

12. The semiconductor structure of claim 10, wherein the copper conductor core comprises from 0.001 atomic percent to 0.2 atomic percent of iridium.

13. The semiconductor structure of claim 10, further comprising a seed region disposed on the underlayer, wherein the seed region comprises from 0.5 atomic percent to 4 atomic percent of iridium.

14. The semiconductor structure of claim 9, wherein the interfacial region is about 5 Å to about 20 Å in thickness.

15. The semiconductor structure of claim 10, wherein the electrical resistivity of the conducting material is 2.3 μΩ/cm or less.

16. The semiconductor structure of claim 9, wherein the conducting core region comprises from 0.001 atomic percent to 0.4 atomic percent of the one or more metals.

17. A conducting material comprising:
    a seed region comprising copper and 0.3 atomic percent to 1.8 atomic percent of iridium;
    a conducting core region comprising copper and from 0.04 atomic percent to 0.1 atomic percent of iridium; and
    an interfacial region, wherein the interfacial region comprises at least 98 atomic percent iridium.

18. The conducting material of claim 17, wherein the conducting core region comprises from 0.05 atomic percent to 0.08 atomic percent of iridium.

19. The conducting material of claim 17, wherein the interfacial region is from 5 Å to 20 Å in thickness.

20. The conducting material of claim 17, wherein the electrical resistivity of the conducting material is 2.1 μΩ/cm or less.

* * * * *